United States Patent
Ohmi et al.

[11] Patent Number: 5,874,777
[45] Date of Patent: Feb. 23, 1999

[54] SEMICONDUCTOR DEVICE WITH ENHANCED THERMAL CONDUCTIVITY

[75] Inventors: Tadahiro Ohmi, 1-17-301, Komegabukuro 2-chome, Aoba-ku, Sendai-shi, Miyagi-ken 980; Kazuo Tsubouchi; Toshiyuki Takewaki, both of Miyagi-ken, all of Japan

[73] Assignee: Tadahiro Ohmi, Miyagi-ken, Japan

[21] Appl. No.: 716,191
[22] PCT Filed: Jan. 29, 1996
[86] PCT No.: PCT/JP96/00165
 § 371 Date: Dec. 2, 1996
 § 102(e) Date: Dec. 2, 1996
[87] PCT Pub. No.: WO96/24159
 PCT Pub. Date: Aug. 8, 1996

[30] Foreign Application Priority Data

Jan. 30, 1995 [JP] Japan ................................. 7-033116

[51] Int. Cl.⁶ ........................... H01L 23/48; H01L 23/52; H01L 29/40
[52] U.S. Cl. ............................. 257/758; 257/635
[58] Field of Search .................... 257/758, 759, 257/635, 750

[56] References Cited

U.S. PATENT DOCUMENTS 5,625,232  4/1997  Numata et al. .
5,663,599  9/1997  Lur ........................................... 257/750
5,675,187  10/1997  Numata et al. .......................... 257/758

FOREIGN PATENT DOCUMENTS 58-86751 (A)  5/1983  Japan ............................. H01L 27/12
1-5038 (A)    1/1989  Japan ............................. H01L 21/95
4-163941 (A)  6/1992  Japan ........................... H01L 21/3205

Primary Examiner—Jerome Jackson
Assistant Examiner—S. V. Clark
Attorney, Agent, or Firm—Randall J. Knuth

[57] ABSTRACT

There is provided a semiconductor device high in speed and in reliability by formation of interlayer dielectric films capable of rapidly transmitting heat as generated at wiring lines and yet less in capacitance.

The semiconductor device of the present invention has multi-layered low-resistance wiring lines such as metal layers as stacked or laminated on a top surface and/or a bottom surface of a conductive substrate with a first dielectric material being sandwiched between adjacent ones thereof, featured in that said first dielectric material between said low-resistance wiring layers has a through-hole formed therein, and that said through-hole comprises a hole (through-hole: TH) filled with at least a conductive material, and a hole (dummy hole; DH) filed with a second dielectric material having thermal conductivity greater than that of said first dielectric material. Furthermorer the device is featured by having similar TH and DH between said low-resistance wiring lines and said conductive substrate, or between a specific low-resistance wiring line positioned at the uppermost layer of said low-resistance wiring lines and a heat release device also.

21 Claims, 17 Drawing Sheets

SEMICONDUCTOR DEVICE WITH ENHANCED THERMAL CONDUCTIVITY

TECHNOLOGICAL FIELD

The present invention relates to a semiconductor device, and more particularly to a semiconductor device which is suitably used for an ultra-high density integrated circuit (ULSI) by forming through holes (TH) or dummy holes (DH) in layer insulators interposed between multilayered wires having low resistance formed of metals or the like to thereby prevent increase in temperature of the wires.

Background Art

With respect to semiconductor devices which are called as ICs or LSIs, the integration of various elements constituting these device has been recently inclined to be enhanced more greatly. This inclination of the semiconductor devices promotes increase in length and area of wires used for these devices, and in order to increase the length and area of the wires, a multilayer interconnection structure comprising two or more layers has been utilized. As the most general multilayer interconnection structure has been known such a structure that plural wiring layers of Al are electrically insulated from one another by $SiO_2$ films or polyimide films. When the wiring structure is complicated as described above, it is not too much to say that a semiconductor device is mostly constructed by wires constituting the multilayer wiring structure from the view of its cross-sectional structure because these wires are disposed to cross over various elements of the semiconductor device.

The problems of the semiconductor device having the multilayer wiring structure as described above and conventional methods of solving these problems will be hereunder described.

(1) Electro-Migration

The semiconductor device as described above is required to be operated at high speed in addition to the requirement of high integration of various elements constituting the semiconductor device, resulting in increase of current which flows in the wires. For example, in conventional semiconductor devices, the current density per unit sectional area of wires is set in the order of $10^5$ ($A/cm^2$).

In such a current density region, occurrence of a phenomenon that metal atoms of wiring materials (for example, Al) are migrated due to the current flowing in the wires, that is, an electromigration phenomenon is a critical problem. In this phenomenon, protuberances called as "hillock" and holes called as "void" occur at places where the metal atoms are accumulated due to the electromigration thereof. As a result, the hillocks cause short-circuit to other wires, and the voids increase wiring resistance and cause local overcurrent to break the wires.

In order to solve this problem, the following methods have been proposed and practically used:

① doping Cu, Ti, Ta or Mg of several percent into Al;
② improvement of a wiring pattern;
③ increase of grain size of Al crystals;
④ coating insulating film on the surface of wires;
⑤ use of metals (w, Mo, Ag or the like) which hardly induce electromigration; and
⑥ lamination of thin film of TiN, W or the like on the upper surface or/and the lower surface of the wires.

(2) Stress-Migration

Recently, not only the integration of various device elements, but also the operation speed of the device has been also required to be further enhanced, and thus a larger amount of current has been required to flow into wires. That is, the required current density per unit sectional area of wires is increasing from the order of $10^5$ ($A/cm^2$) to the order of $10^6$ ($A/cm^2$). A design trend to form finer wiring patterns reduces the sectional area of the wires to a smaller value than the conventional devices. On the other hand, in order to keep the driving capability of the devices, the current flowing in the wires must be kept to have the same current level as the conventional devices. Therefore, the current density increases more and more every the generation of LSIs is changed. However, when current having such a large current density flows in low-resistance wires, the wires are heated by Joule heat.

Further, a high-frequency pulse signal (current) such as clocks, etc. flows in the semiconductor device. This pulse signal is also required to have higher frequency in order to achieve the higher-speed operation of the elements. The increase of the frequency of the pulse signal applied to the semiconductor device causes occurrence of a heat cycle in low-resistance wires due to variation of the Joule heat. The heat cycle causes the wires to make an expansion and contraction motion, and the motion brings the wires with a periodical stress (heat stress). If such a heat stress is applied to the wires, there would occur some problems such as the increase in electrical resistance of the wires and the break of the wires due to migration of the atoms of wiring materials (i.e., stress migration), reduction in mechanical strength due to work hardening of metals, etc., resulting in deterioration of the wires and great loss of the reliability of the wires, thus the reliability of the overall LSIs.

(3) RC time constant

The operation speed of the semiconductor devices as described above is greatly dependent on the product between the resistance value R of the wire itself and the capacity C of the wire, that is, RC time constant. From this viewpoint, in order to increase the operation speed of the semiconductor devices, it is required to reduce the resistance value of the wires and use an insulator having a low dielectric constant as a layer insulator.

Next, the present countermeasures to the three problems will be described.

(a) A silicon oxide film such as a boron phosphorus doped silicon oxide film (BPSG: Boron PhosphoSilicate Glass), a non-doped silicon oxide film (NSG: Non-doped Silicate Glass) or the like has been used as a layer insulator. The resistivity and thermal conductivity of these materials are equal to 3.9 and 0.013 W/cm·K respectively. These values restrict the operation speed of the LSIs, and they are insufficient to quickly transfer the heat occurring in the wires.

(b) Polymer materials having low resistivity have been proposed to reduce the RC time constant. Specifically, polyimide group, parylene group and teflon group are used as the polymer materials as described above. However, in general, polymer materials which are organic materials have low thermal conductivity. For example, the thermal conductivity of polyimide is equal to 0.0017 to 0.0038 W/cm·K, and the thermal conductivity of teflon is equal to 0.0026 for PFA, and 0.0027 for PTFE. These numerical values is smaller than that of the silicon oxide film (0.013 W/cm·K) by about one order. Accordingly, when the polymer materials are used, the heat occurring in the wires cannot be transferred at a higher speed than when the silicon oxide film is used.

As described above, those suitable materials which have both of a small dielectric constant characteristic and a large thermal conductivity characteristic have not been hitherto practically used. Therefore, those layer insulators which can quickly transfer the heat occurring in wires and reduce the capacity of the wires have not yet been developed to a practical level.

In view of the present situation as described above, the present invention has an object to provide a semiconductor device which can quickly transfer the heat occurring in wires, and which can be operated at high speed and with high reliability by forming layer insulators which can reduce the capacity of the wires.

DISCLOSURE OF THE INVENTION

In order to attain the above object, according to a first aspect of the present invention, a semiconductor device which comprises a conductive substrate, a first insulator and multilayered wires having low-resistance such as metal or the like which are laminated through the first insulator on the obverse surface and/or the back surface of the conductive substrate, is characterized in that via holes are formed in the first insulator interposed between the low-resistance wires, the via holes comprising at least holes (through holes: TH) filled with a conductive material and holes (dummy holes: DH) filled with a second insulator having higher thermal conductivity than the first insulator.

According to a second aspect of the present invention, a semiconductor device which comprises a conductive substrate, a first insulator and multilayered wires having low-resistance such as metal or the like which are laminated through the first insulator on the obverse surface and/or the back surface of the conductive substrate, is characterized in that via holes are formed in the first insulator interposed between the low-resistance wires and the conductive substrate, the via holes comprising at least holes (through holes: TH) filled with a conductive material and holes (dummy holes: DH) filled with a second insulator having higher thermal conductivity than the first insulators.

Further, according to a third aspect of the present inventions a semiconductor device which comprises a conductive substrate, a first insulator and multilayered wires having low-resistance such as metal or the like which are laminated through the first insulator on the obverse surface and/or the back surface of the conductive substrate, is characterized in that a heat radiating device is disposed on the surface of the uppermost low-resistance wire of the low-resistance wires through the first insulator, and via holes are formed in the first insulator between the uppermost low-resistance wire and the heat radiating device, the via holes comprising at least holes (through holes: TH) filled with a conductive material and holes (dummy holes: DH) filled with a second insulator having higher thermal conductivity than the first insulator, or the via holes comprising only through holes (through holes: TH) filled with a conductive material.

Function (Claim 1)

According to the invention of Claim 1, the first insulator between the low-resistance wires is provided with the via holes, and the via holes comprise at least the through holes (TH) filled with the conductive material and the dummy holes filled with the second insulator having larger thermal conductivity than the first insulator. Therefore, Joule heat occurring at any low-resistance wire a can be efficiently transferred through the first insulator to other low-resistance wires b and c which are located above and beneath the low-resistance wire a, so that occurrence of electro-migration and stress-migration in the low-resistance wire a can be avoided.

Further, any material having a low thermal conductivity and a small dielectric constant may be used as the first insulator between the low-resistance wires. In this case, the capacity of the low-resistance wires can be reduced, and the RC time constant thereon can be lowered.

(Claim 2)

According to the invention of Claim 2, the first insulator between the low-resistance wires and the conductive substrate is provided with the via holes, and the via holes comprise at least the through holes (TH) filled with the conductive material and the dummy holes (DH) filled with the second insulator having large thermal conductivity than the first insulator. Therefore, the Joule heat occurring in the low-resistance wires can be efficiently transferred to the conductive substrate which is located below the low-resistance wires. As a result, occurrence of the electro-migration and the stress migration in the low-resistance wires can be avoided.

Further, any material having a low thermal conductivity and a small dielectric constant may be used as the first insulator between the low-resistance wires and the conductive substrate Therefore, the parasitic capacitance between the low-resistance wires and the conductive substrate can be reduced to lower the RC time constant.

(Claim 3)

According to the invention of claim 3, the heat radiating device is disposed through the first insulator on the surface of the uppermost low-resistance wire of the low-resistance wires, and the via holes are formed in the first insulator between the uppermost low-resistance wire and the heat radiating device. The via holes comprise at least the through holes (TH) filled with the conductive material, and the dummy holes (DH) filled with the second insulator having larger thermal conductivity than the first insulator, or the via holes comprise only the through holes (TH) filled with the conductive material. Therefore, the Joule heat occurring in the low-resistance wires can be efficiently transferred to the heat radiating device located above the low-resistance wires. As a result, occurrence of the electro-migration and the stress-migration in the low-resistance wires can be avoided.

Further, any material having a low thermal conductivity and a small dielectric constant may be used as the first insulator between the low-resistance wires and the heat radiating device. As a result, the parasitic capacitance between the low-resistance wires and the heat radiating device can be reduced to lower the RC time constant.

EMBODIMENT EXAMPLES (Conductive substrate)

As the conductive substrate of the present invention may be used metal which is coated with metal, semiconductor or insulator film and then further coated with semiconductor film, or insulator coated with semiconductor film or the like.

At least the conductivity of the material constituting the obverse surface and/or the back surface of the conductive substrate is preferably set to $10^{-8}$ $(\Omega\ cm)^{-1}$ or more because it is used as the conductive substrate. Further, the obverse surface and/or the back surface of the conductive substrate is preferably as flat as possible because various elements are formed thereon. As the metal is preferably used Ta, Ti, W, Co, Mo. Hf, Ni, Zr, Cr, V, Pd, Au, Pt, Mn, Nb, Cu, Ag or Al. As the semiconductor is preferably used Si, Ge, GaAs or C (diamond). As the insulator coated with the semiconductor is preferably used a mixture film formed of $SiO_2$ (silicon oxide), SiN (silicon nitride), AlN (aluminum nitride), $Al_2O_3$ (aluminum oxide) or $SiO_xN_y$. As the metal which is coated with the insulator film and then coated with the semiconductor film is preferably used Ta, Ti, W, Co, Mo, Hf, Ni, Zr, Cr, V, Pd, Au, Pt, Mn, Nb, Cu, Ag or Al.

(First insulator)

As the first insulator of the present invention may be used $SiO_2$, NSG, BPSG, PSG, silicon oxide film or polymer material (polyimide, teflon, parylene). The first insulator is used to electrically separate the low-resistance wires located above and below it from one another. Accordingly, the conductivity of the material constituting the first insulator is preferably set to $10^{-18}$ $(\Omega\ cm)^{-1}$ or less. The first insulator is generally formed as a thin film. The thickness thereof is preferably set to 50 nm to 10 $\mu$m.

As a method of forming the first insulator may be used various CVD (Chemical Vapor Deposition) methods using heat, plasma, light or the like as energy, various sputtering methods or the like.

(Multilayered low-resistance wires of metal or the like which are laminated through the first insulator)

"The multilayered low-resistance wires of metal or the like which are laminated through the first insulator" according to the present invention function to connect various elements to one another and transmit electrical signals therethrough in semiconductor devices, particularly ICs or LSIs.

Metal thin films which will be used as the low-resistance wires as described above are formed by a metal deposition or sputtering method under high vacuum condition or a CVD method under high-temperature condition using metal chloride so that no intermediate layer such as an oxide is formed between the metal film and the semiconductor surface.

The following materials may be used as the material of the metal thin film. That is, for Si semiconductor devices may be used Al, Cr, W, Mo, Cu, Ag, Au, Ti, $WSi_2$, $MoSi_2$, $TiSi_2$, alloy having the above elements as main components (for example, Cu—Mg alloy, Cu—Nb alloy, Cu—Al alloy), or wires having a layered structure of the above materials (for example, Al—Ti—Al, TiN-Al alloy-TiN, W—Al alloy-W), and for GaAs semiconductor devices may be used Au, Al, Ni, Pt, or alloy having the above elements as main components. Particularly, Al, Cu, Agr Au or alloy having the above elements as main components are preferentially used for the Si semiconductor devices for the following reasons:

(A) The contact type between these metal materials and electrical materials is ohmic contact;

(B) Adhesion to the insulator ($SiO_2$, $Si_3N_4$, $Al_2O_3$, etc.) is excellent;

(C) Conductivity is large;

(D) Working is easy, and working precision is high; and (E) These metal materials are stable chemically, physically and electrically.

In the semiconductor device, the multilayer wiring is more promoted as the integration of the elements is enhanced. As a multilayered wiring structure may be known a structure that the wires of respective layers of Al are insulated from one another by $SiO_2$ films or polymer films. The following is problems to be solved for the multilayered wires.

(a) To avoid the cut-off of an upper-layer wire and the short-circuit between an upper-layer wire and a lower-layer due to a step at an intersection portion between the lower-layer wire and the upper-layer wire;

(b) Countermeasure on the electro-migration as described above (c) Countermeasure on the thermal stress migration as described above (d) Countermeasure on the RC time constant According to the present invention, the above problems (b) to (d) can be simultaneously solved by providing "holes (dummy holes: DH) filled with a second insulator having a larger thermal conductivity than the first insulator".

(Semiconductor Device)

In the present invention, the semiconductor device is generally defined as a device in which electrical circuits and electrical elements are fabricated in high density on a single board, that is, transistors, resistors, capacitors, etc. are integrated, and if the integration is more enhanced, the device is called as an LSI (Large Scale Integrated Circuit). The substrate used for the semiconductor device is not limited to Si, but it may be formed of GaAs or the like.

(Via holes formed in the first insulator)

The "via holes formed in the first insulator" of the present invention are used to connect the low-resistance wires located above and below the first insulator. These via holes are generally formed by a photoetching method. The diameter of each via hole is normally determined by the width of the low-resistance wires located above and below the hole. Further, as described later, each via hole is used as a through hole or a dummy hole.

(Holes (through holes: TH) filled with a conductive material)

The through holes of the present invention are defined as holes which are contained in the "via holes formed in the first insulator" and filled with the conductive material. The through holes function to make an electrical conduction between the low-resistance wires which are electrically separated by the first insulator and located above and below the first insulator. The through holes can perform not only transmission of electrical signals from one low-resistance wire to the other low-resistance wire, but also heat transfer from one low-resistance wire to the other low-resistance low. That is, through the through holes, not only the heat is transferred, but also the electrical signals are transmitted. Accordingly, the through holes are not disposed at any positions for the purpose of avoiding the heating of low-resistance wires.

(Holes (dummy hole: DH) filled with second insulator having larger thermal conductivity than first insulator)

(Dummy hole: DH)

The dummy holes of the present invention are defined as holes which are contained in the "via holes formed in the first insulator" and filled with the second insulator having larger thermal conductivity than the first insulator". Between low-resistance wires which are located above and below the first insulator and electrically separated from each other by the first insulator, the dummy holes can more quickly transfer heat from one low-resistance wire to the other low-resistance wire than the first insulator. That is, the dummy holes can suppress increase of temperature by quickly transferring the heat. Further, the dummy holes have no function of transmitting electrical signals because they are formed of insulating material. Accordingly, the dummy holes may be disposed at any positions in the semiconductor device for the purpose of avoiding the heating of the low-resistance wires.

(Heat radiating device)

As the heating device of the present invention may be used a conductive device which is formed of a material having high thermal conductivity (for example, Ag. Cu, Au, Al, Ta, Mo). Of these materials, Cu is more preferably used because it has high thermal conductivity and is low in price. Further, a heating device having a fin structure is more frequently used to increase a heat radiation efficiency.

(Lifetime $\tau$ of electro- and stress-migration)

The following Black equation (I) which is an empirical equation proposed by Black (J. R. Black: IEEE Tracs. on Electron Devices, ED-16, 338 (1969), hereinafter referred to as "document 1") is given to the lifetime $\tau$ of the electro- and stress-migration:

$$\tau = (A/J^n) \exp(Ea/kT) \quad (I)$$

That is, the lifetime $\tau$ of the electro and stress migration is inversely proportional in the n-th power of current density J flowing in the wires, and has an activating energy Ea. Here, k represents Boltzmann's constant, and T represents the temperature of the wires. A large number of experiments and arguments have been made on the value of n in the Black equation. In general, n is estimated to be equal to 1 to 3. However, except for an estimation under a special condition, n is estimated to be equal to 1.9 to 2.2, that is, 2 (for example, document 2: M. J. Attardo, and R. Rosemberg: J. Appl. Phys. 41, 2381 (1970)). Further, an experiment result that the density of voids is proportional to the current density while the growth rate of the voids is also proportional to the current density, and thus the lifetime $\tau$ is inversely proportional to the product of the void density and the void growth rate, that is, the second power of the current density was obtained for Al alloy (for example, document 3 : K. Hinode, T. Furusawa, and Y. Homma: J. Appl. Phys. 74, 201–206 (1993)).

In general, when high-density current flows in wires, the temperature of the wires increases and a high-density electron stream impinges against the metal atoms of the wires, so that the metal atoms migrate and form voids and hillocks. Accordingly, it is reasonable to consider that the lifetime $\tau$ of the electro and stress migration is inversely proportional to the power $\rho J^2$ which is applied per unit volume of the wire.

In order to estimate the lifetime of the wires, the inventors made an acceleration estimation test for the electro and stress migration under the following condition: wire temperature Ts=390 to 530K current density Js=1.4 to 2.2× $10^7$ A/cm$^2$, and N$_2$ atmosphere.

FIG. 8 is a graph showing the experiment result. From FIG. 8, it was found that an Arrhenius's plot of the product between the wire lifetime $\tau$ and the power $\rho J^2$ applied per unit volume of the wire is linear, that is, it was experimentally confirmed that the wire lifetime $\tau$ is inversely proportional to $\rho J^2$.

Accordingly, the black equation was estimated to be represented by the following modified Black equation (II):

$$\tau = (Eo/\rho J^2) \exp(Ea/kT) \quad (11)$$

Therefore, the estimation of the lifetime $\tau$ of the electro and stress migration of the LSI was made by using the equation (II) in the present invention.

FIG. 9 is a graph in which the experiment result is plotted in terms of the relationship of J and $\tau$. In order to guarantee 10-year lifetime on LSIs, it is necessary to guarantee 30-year lifetime on wires or the basis of the acceleration estimation result of the wires. Further, with respect to C-MOS microprocessors of 0.18 μm process, on the basis of the demand in design, the current density of a clock line portion having the highest current activity is equal to $2\times10^6$ A/cm$^2$.

Therefore, it is judged from FIG. 9 to suppress an increase of temperature except for the Junction temperature (the temperature of an LSI chip which is determined by power consumption of the LSI, and it is equal to 85° C. at maximum), that is, the wire temperature within 5° C.

(DESCRIPTION OF REFERENCE NUMERALS)

Figure 1:
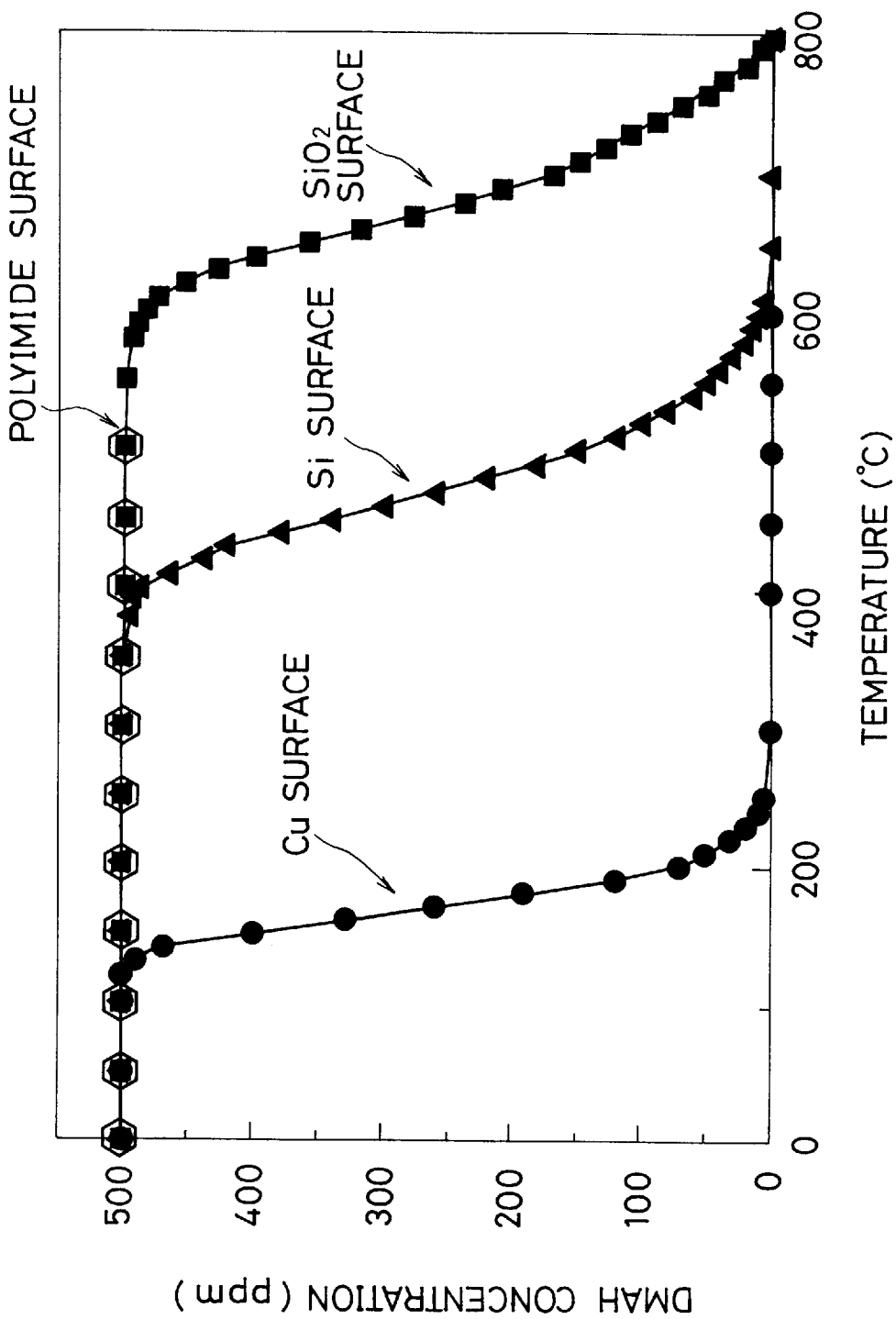
FIG. 1 is a graph showing a measurement result of gas concentration after thermal decomposition with variation of thermal decomposition temperature.

421, 423, 425 . . . example through hole (TH) locations 422, 424, 426 . . . example dummy hole (DH) locations 400, 1000, 1200, 1400, 1500, 1600, 700 . . . conductive substrate 401, 403, 405, 407, 409, 411, 413, 415, 1001, 1004, 1201, 1204, 1401, 1404, 1501, 1504, 1601, 1604, 1701, 1704 . . . first insulator 402, 404, 406, 408, 410, 412, 414, 1002, 1232, 1402, 1502, 1602, 1702 . . . low-resistance wires of metal or the like 416 . . . heat radiating device 1003, 1203, 1603, 1703 . . . third insulator 1205 . . . portion in which the surfwce of low-resistance wire of metal or the like is coated with silicide or oxide or metal constituting the metal wire or alloy component 1403, 1605, 1705 . . . fourth insulator 1503 . . . fourth insulator whose surface is flattened.

BEST MODE FOR CARRYING OUT THE INVENTION (Embodiment 1)

In this embodiment the thermal or heat decomposition characteristic of demethyl aluminum hydride (DMAH) as gaseous compound was investigated with respect to the surface of silicon (Si), the surface of silicon oxide film ($SiO_2$), the surface of copper (Cu), or the surface of polyimide as one exemplary polymer molecule. FIG. 1 demonstrates the results of gas concentration after thermal decomposition while causing the thermal decomposition temperature to vary in the range of from 0° to 800° C. Note that, for the case of polyimide only, the measurement was done in an extended range covering up to 500° C. The gas chromatography was used for measurement of the gas concentration.

The temperature at which demethyl aluminum hydride (DMAH) initiates decomposition and the temperature where at such decomposition was completed are analyzed from FIG. 1 and summarized in Table 1 as follows.

TABLE 1

| Kind of Surface | T1 (°C.) | T2 (°C.) |
|---|---|---|
| silicon | 400 | 600 |
| silicon oxide | 600 | 800 |
| copper | 140 | 240 |
| polyimide | not decomposed up to 500° C. | |

Due to the decomposition, Al film was formed on respective surfaces other than polyimide. Also, in the case where nitrogen trifluoride ($NF_3$) as gaseous compound is simultaneously flown together with IMAH, the tendency of Table 1 was kept unchanged. Note here that the film on each surface obtained by decomposition was AIN.

Furthermore, in this embodiment, the condition of AIN-film formation on copper surface was studied by the thermal CVD method while making use of DMAH and $NF_3$ as original gases. A polyimide film was provided in advance on the copper surface as a first dielectric material; while the one having through-holes formed therein by photolithographic techniques was employed, formation of an AIN film was attempted thereon.

Figure 2:
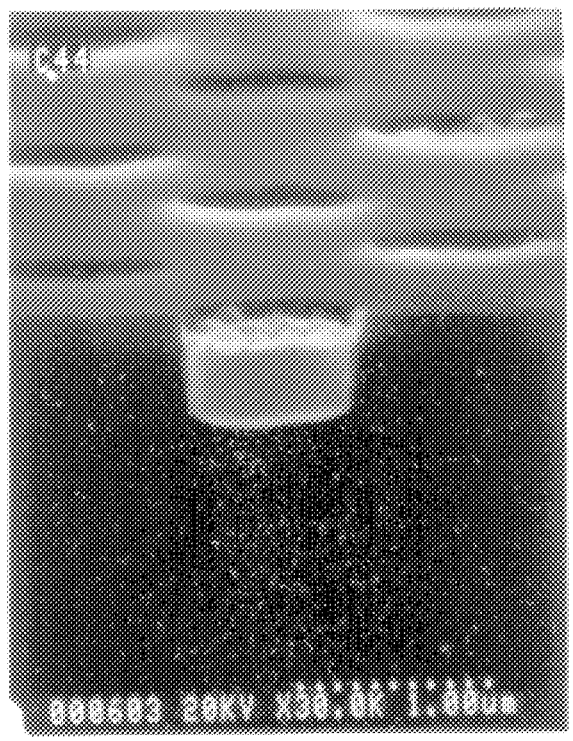
FIG. 2 is a photograph of a manufactured sample which is obtained by the scanning electron microscope.
Figure 3:
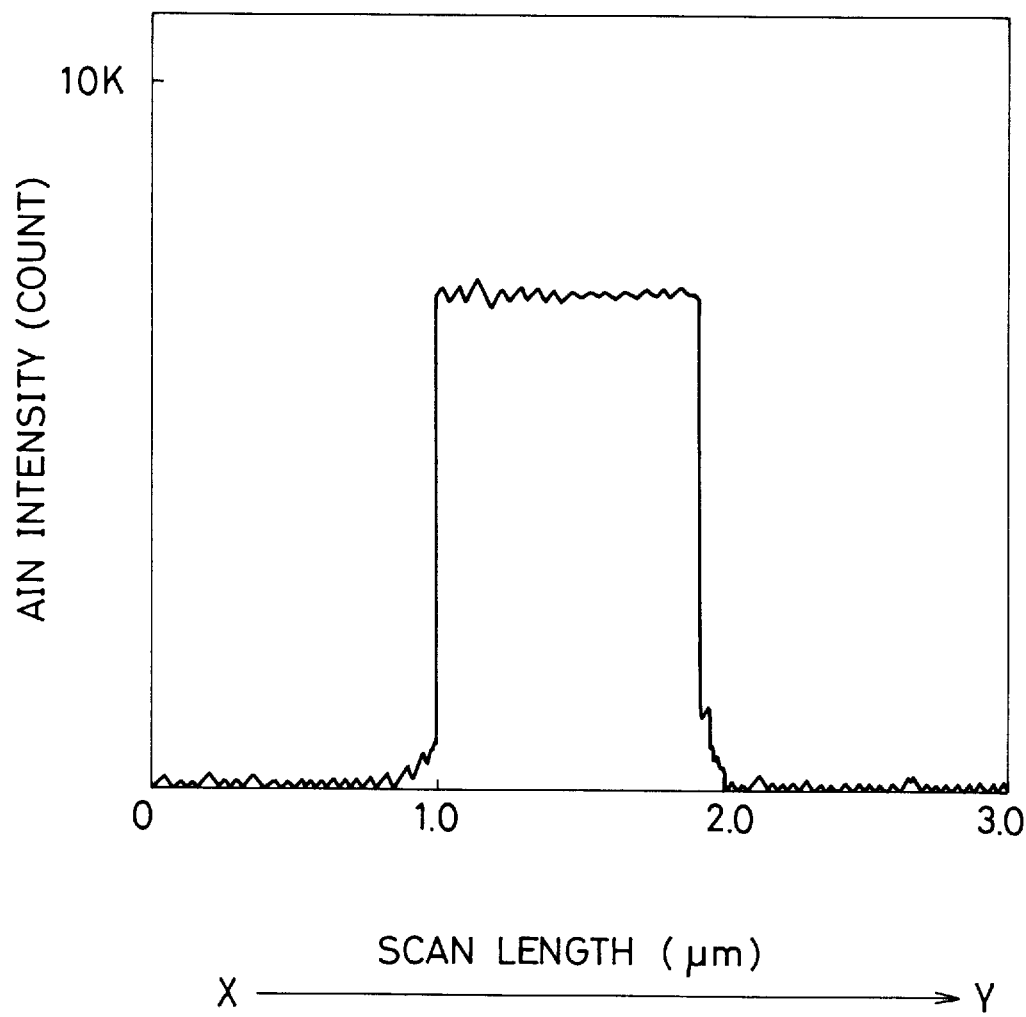
FIG. 3 is a graph showing a composition analysis result of the surface of the sample which is obtained by EPMA (electron probe microanalysis)

FIG. 2 is a scanning electron microscope (SEM) photograph of a cross-section of one sample as manufactured. FIG. 3 shows the results of composition analysis of the surface of such sample manufactured, using electron probe microanalysis (EPAM) techniques. The substrate temperature during formation of the AIN film was set at 200° C. It was understood from viewing FIG. 2 and FIG. 3 that the AIN film was deposited on the copper surface only, and that no AIN film was found on the surface of polyimride. Additionally, the fact that the material formed is AIN was assured by the presence of peaks of aluminum and nitrogen by X-ray photo spectroscopy (XPS) techniques.

From the above results, it has been judged that it is possible to fill the through-hole of the first dielectric material made of polyimide with the second dielectric material consisting of AIN.

While the case of copper used as the metal surface has been described herein, it has been separately confirmed that similar results may be obtained insofar as the surface of substrate exhibits some conductivity. More specifically, it has been found that when AIN is to be grown on the conductive substrate, the following materials can be employed as such conductive substrate: a metal, semiconductor, metal as coated by a dielectric film and further coated by a semiconductor film, or insulator as coated by a semiconductor film.

It has also been found that an $SiO_2$ film can be used as the first dielectric material in the alternative of the polyimide film.

Further, while a description here was made concerning the manufacture of through-holes with respect to the first dielectric material on the conductive substrate, separate experimentation tells that the above may similarly be applied to the first dielectric materials between metal wiring lines, or to the first dielectric material between one metal wiring line and its associated heat release device.

(Embodiment 2)

In this embodiment consideration was given by altering the material constituting the first dielectric materials to the case where only the through-holes are provided between respective wiring-line layers of the semiconductor device, between the wiring-line layer and conductive substrate, and between wiring-line layer and heat release device. Silicon oxide, polyimide resin, and aluminum nitride were employed as the material constituting the first dielectric materials—namely, the interlayer dielectric materials. Cu was used not only as the wiring line material but also as TH material.

Figure 4:
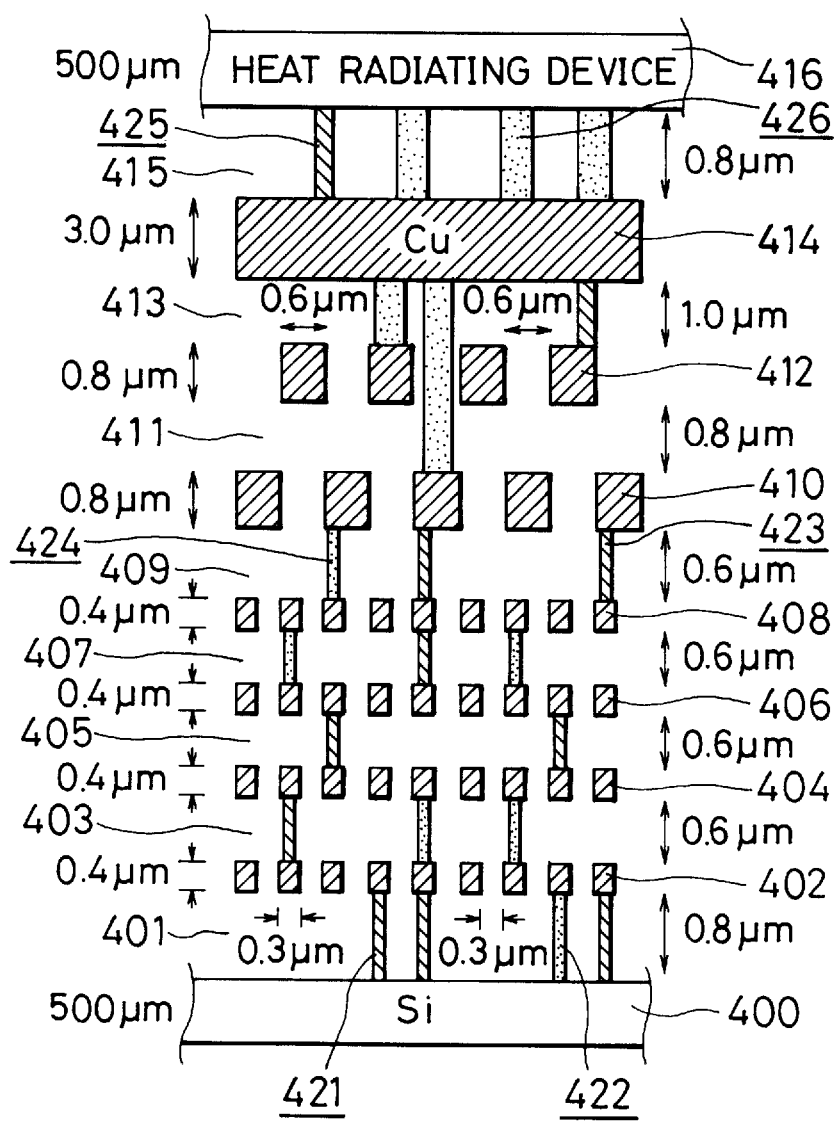
FIG. 4 is a schematic diagram showing the section of a semiconductor device used in the present invention.

FIG. 4 is a schematic diagram showing a cross-section of a semiconductor device as reduced to practice in this embodiment. The semiconductor device has a conductive substrate (Si: thickness of 500 $\mu$m), and seven separate layers of metal wiring lines (Cu) which are provided as the low-resistance wiring lines and are successively stacked or laminated on the substrate surface with the first dielectric material being sandwiched between adjacent ones thereof. The metal wiring lines in respective layers are sequentially called M1, M2, M3, M4, M5, M6, M7 in the order as looked at from the nearest one to the conductive substrate. Table 2 summarizes the data as to size and other factors of these metal wiring lines.

TABLE 2

| Title of Metal Wiring Line M | Title of First Dielectric Material I | M Width ($\mu$m) | M Thickness ($\mu$m) | M Distance ($\mu$m) | Thickness ($\mu$m) |
|---|---|---|---|---|---|
| Heat Release: C | | | | | |
| | I8: between C-M7 | | | | 1–10 |
| M7 | | 5.4 | 3.0 | — | |
| | I7:between M7–M6 | | | | 1.0 |
| M6 | | 0.6 | 0.8 | 0.6 | |
| | I6:between M6–M5 | | | | 0.8 |
| M5 | | 0.6 | 0.8 | 0.6 | |
| | I5:between M5–M4 | | | | 0.6 |
| M4 | | 0.3 | 0.4 | 0.3 | |
| | I4:between M4–M3 | | | | 0.6 |
| M3 | | 0.3 | 0.4 | 0.3 | |
| | I3:between M3–M2 | | | | 0.6 |
| M2 | I2:between | 0.3 | 0.4 | 0.3 | 0.6 |

TABLE 2-continued

| Title of Metal Wiring Line M | Title of First Dielectric Material I | M Width (μm) | M Thickness (μm) | M Distance (μm) | Thickness (μm) |
|---|---|---|---|---|---|
| | M2–M1 | 0.3 | 0.4 | 0.3 | |
| M1 | I1:between M1–B | | | | 0.8 |
| Substrate: B | | | | | |

Table 3 summarizes the density of current as flown in each metal wiring-line layer, the activation rate (time ratio of actually flowing pulsate current) of current flowing in each wiring-line layer, and the through-hole (TH) ratio as provided in each first dielectric material.

The TH ratio may be the rate (%) of β to α, where α is the value of the wiring-line length L of low-resistance metal wiring line divided by wiring-line pitch P, and β is the number of those holes (through-holes: TH) of said through-holes which are filled with conductive material in said wiring-line length L. More specifically, this may be represented by the equation: TH ratio=100×(β/α).

As per The TH ratio, two kinds of conditions of a, b were studied. The condition a is the case where TH was provided in respective first dielectric materials (I1 to I8) at the rate shown in Table 3, whereas the condition b is the case where TH was not provided in any first dielectric materials (I1 to I8).

TABLE 3

| Title of Metal wiring Line | Current Density (A cm$^2$) | Activation Ratio (%) | Title of 1st Dielectric Material I | TH Ratio Condition a | TH Ratio Condition b |
|---|---|---|---|---|---|
| Heat Release: C | | | | | |
| | | | I8: C–M7 | 15.0 | 0 |
| M7 | 2 × 10$^5$ | 100 | | | |
| | | | I7: M7–M6 | 0.3 | 0 |
| M6 | 2 × 10$^6$ | 50 | | | |
| | | | I6: M6–M5 | 0.4 | 0 |
| M5 | 2 × 10$^6$ | 50 | | | |
| | | | I5: M5–M4 | 0.6 | 0 |
| M4 | 2 × 10$^6$ | 50 | | | |
| | | | I4: M4–M3 | 0.9 | 0 |
| M3 | 2 × 10$^6$ | 50 | | | |
| | | | I3: M3–M2 | 1.3 | 0 |
| M2 | 1 × 10$^6$ | 50 | | | |
| | | | I2: M2–M1 | 1.5 | 0 |
| M1 | 1 × 10$^6$ | 50 | | | |
| | | | I1: M1–B | 15.0 | 0 |
| Substrate: B | | | | | |

Table 4 is the results of investigation as to the relation of respective interlayer dielectric materials and wiring-line temperature. The wiring-line temperature may refer to a temperature increase excluding Junction temperature (the temperature of LSI chip as determined depending upon LSI's power consumption; normally, 85_C in maximum). Numerals within "[ ]" each represents the value with Junction temperature being added thereto.

TABLE 4

| Interlayer Dielectric Film Material | Wirng-Line Temp. [the value added with Junction temperature (=85° C.)] | | Ratio: a/b |
|---|---|---|---|
| | Condition a: TH used | Condition b: TH absent | |
| SiO$_2$ | 7.7 [92.7] | 16.3 [101.3] | 0.47 |
| polyimide | 15.8 [100.8] | 81.3 [166.3] | 0.21 |
| AlN | 0.2 [85.2] | 0.2 [85.2] | 1.00 |

From Table 3 and Table 4, it has been found that while the wiring-line temperature of polyimide varies significantly depending upon the TH ratio, almost no interference was observed in AlN. It has thus been judged that the above results indicate that AlN acting as the interlayer dielectric material per se may offer the ability of heat conductivity greater than that of any other dielectric films used.

(Embodiment 3)

In this embodiment investigation was done for the case where only the through-holes (TH) are provided between the wiring-line layers and conductive substrate and between wiring-line layers and heat release device whereas both the through-holes (TH) and dummy holes (DH) are arranged between respective wiring-line layers, while letting the (TH+DH) ratio be modifiable. Note here that the through-holes consisting of TH or DH were disposed with uniform area ratio at even intervals of wiring line pitch on wiring lines. In other words, the through-holes are arranged so that these are distributed among respective wiring-line pitch points with the (TH+DH) ratio defined. The TH ratio provided between the wiring-line layers and conductive substrate and between wiring-line layers and heat release device was fixed at 15%. Concerning the (TH+DH) ratio, three kinds of conditions—that is, 1% (condition c), 5% (condition d) and 10% (condition e)—were under consideration. Polyimide or silicon oxide was employed as the first dielectric materials, i.e., the interlayer dielectric materials; Cu was used as TH material; and, AlN of high thermal conductivity was used as DE material.

The remaining points were the same as those in the embodiment 2.

Table 5 summarizes the TH ratio or (TH+DH) ratio under the conditions a to e. The conditions a, b are those as has been described in the embodiment 2. Specifically, the condition a is the case of exclusive arrangement of TH only, whereas the condition b is the cases of complete absence of TH arid DH.

TABLE 5

| Title of Metal Wiring Line M | Title of 1st Dielectric Material I | TH ratio or (TH + DH) Ratio | | | | |
|---|---|---|---|---|---|---|
| | | Condition a | Condition b | Condition c | Condition d | Condition e |
| Heat Release:C | | | | | | |
| | I8: C–M7 | 15.0 | 0 | 15.0 | 15.0 | 15.0 |
| M7 | | | | | | |
| | I7: M7–M6 | 0.3 | 0 | 1.0 | 5.0 | 10.0 |
| M6 | | | | | | |
| | I6: M6–M5 | 0.4 | 0 | 1.0 | 5.0 | 10.0 |
| M5 | | | | | | |
| | I5: M5–M4 | 0.6 | 0 | 1.0 | 5.0 | 10.0 |

TABLE 5-continued

| Title of Metal | Title of 1st Dielectric Material I | TH ratio or (TH + DH) Ratio | | | | |
|---|---|---|---|---|---|---|
| Wiring Line M | | Condition a | Condition b | Condition c | Condition d | Condition e |
| M4 | | | | | | |
| | I4: M4–M3 | 0.9 | 0 | 1.0 | 5.0 | 10.0 |
| M3 | | | | | | |
| | I3: M3–M2 | 1.3 | 0 | 1.0 | 5.0 | 10.0 |
| M2 | | | | | | |
| | I2: M2–M1 | 1.8 | 0 | 1.0 | 5.0 | 10.0 |
| M1 | | | | | | |
| | I1: M1–B | 15.0 | 0 | 15.0 | 15.0 | 15.0 |
| Substrate: B | | | | | | |

Table 6 presents the investigation results as to the relation of the wiring-line temperature versus the (TH+DH) ratio with respect to each of the interlayer dielectric materials. The term "wiring-line temperature" refers to a temperature increase excluding Junction temperature (the temperature of LSI chip as determined by LSI's power consumption; normally, 85_C in maximum). Numerals within "( )" each represents the standardized value under the condition b.

TABLE 6

| Material of Interlayer Dielectric Film | Wiring-Line Temp. (°C.) (standardized value under condition b) | | | | |
|---|---|---|---|---|---|
| | Condition a | Condition b | Condition c | Condition d | Condition e |
| $SiO_2$ | 7.7 (0.47) | 16.3 (1) | 7.1 (0.44) | 2.7 (0.17) | 1.7 (0.10) |
| polyimide | 15.8 (0.19) | 81.3 (1) | 12.3 (0.15) | 3.2 (0.04) | 1.9 (0.02) |
| AlN | 0.2 (1) | 0.2 (1) | — | — | — |

From Table 5 and Table 6, it has been found that in the case of polyimide, the wiring-line temperature was significantly decreased with an increase in the (TH+DH) ratio. Especially, it has been demonstrated that when the (TH+DH) ratio is at 10%, the wiring-line temperature was 1.9° C.; even by taking account of presence of Junction temperature, it remains incapable of increasing beyond 86.9° C. Also, the above results have been confirmed by separate simulation experimentation.

Figure 5:
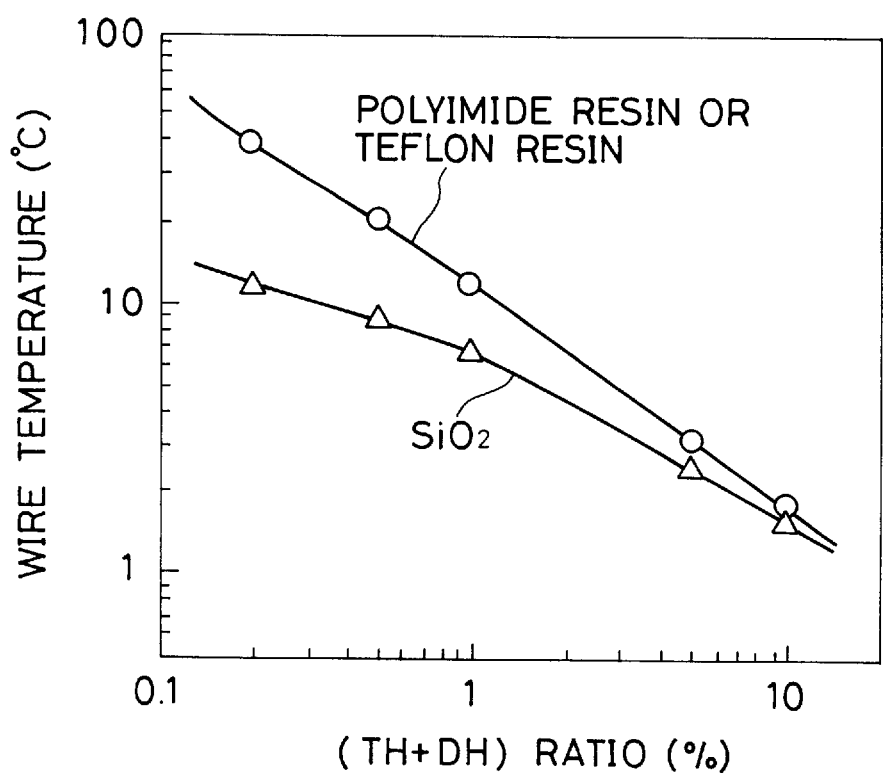
FIG. 5 is a graph showing the relationship between the wire temperature relative to each layer insulator and the ratio of (THE+DH)
Figure 6:
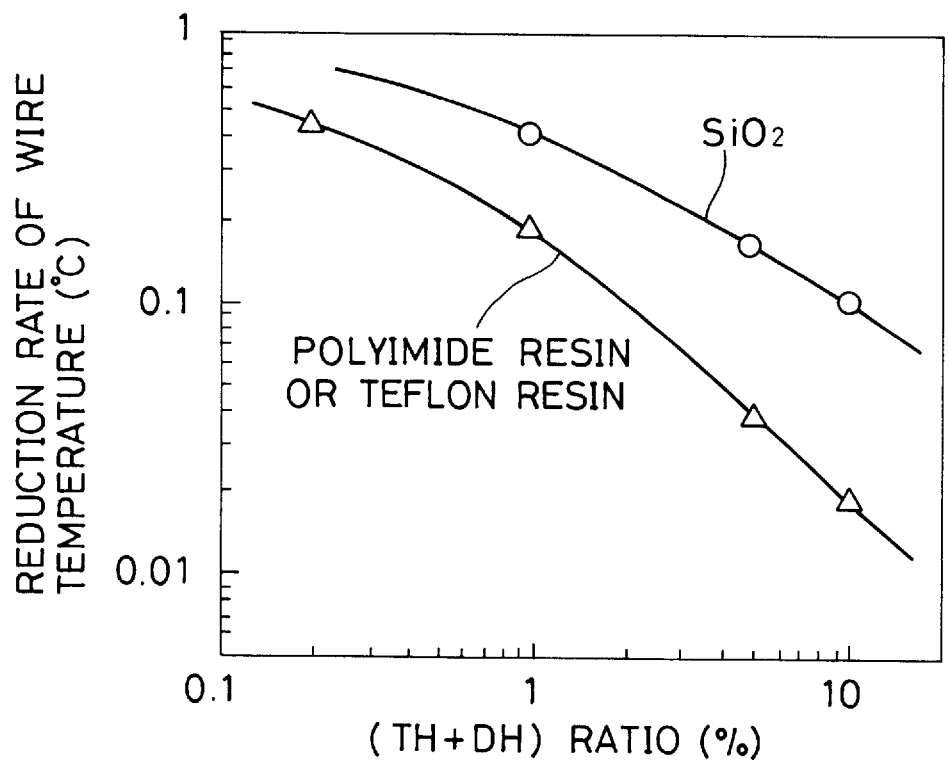
FIG. 6 is a graph showing the relationship between the reduction rate of the wire temperature reduction rate to each layer insulator and the ratio of (TH+DH)

FIG. 5 and FIG. 6 are graphic representations of the result of Table 6. In order to reduce to practice the semiconductor device employing the 0.18 μm process techniques, it is required that the wiring-line temperature be as small as 5° C. or lower. To satisfy this condition, it has been found that the (TH+DH) ratio falls within the range as defined by the equations that follow.

For the case where the interlayer dielectric film is $SiO_2$ $$(TH+DH) \text{ ratio}: 100 \times (\beta+\gamma)/\alpha \leq 2;$$

when the interlayer dielectric film is polyimide-based resin or Teflon-based resin which is ⅕ $SiO_2$ in coefficient of thermal expansion, $$(TH+DH) \text{ ratio}: 100 \times (\beta+\gamma)/\alpha \geq 3,$$

where α, β and γ are specific value or numbers as defined by

α: the value of the wiring-line length L of low-resistance wiring lines divided by wiring-line pitch P, β: the number of those holes (through-holes: TH) filled with conductive material in said wiring-line length L, γ: the number of those holes (dummy holes: DH) filled with the second dielectric material having its thermal conductivity greater than that of said first dielectric material in said wiring-line length L.

Figure 7:
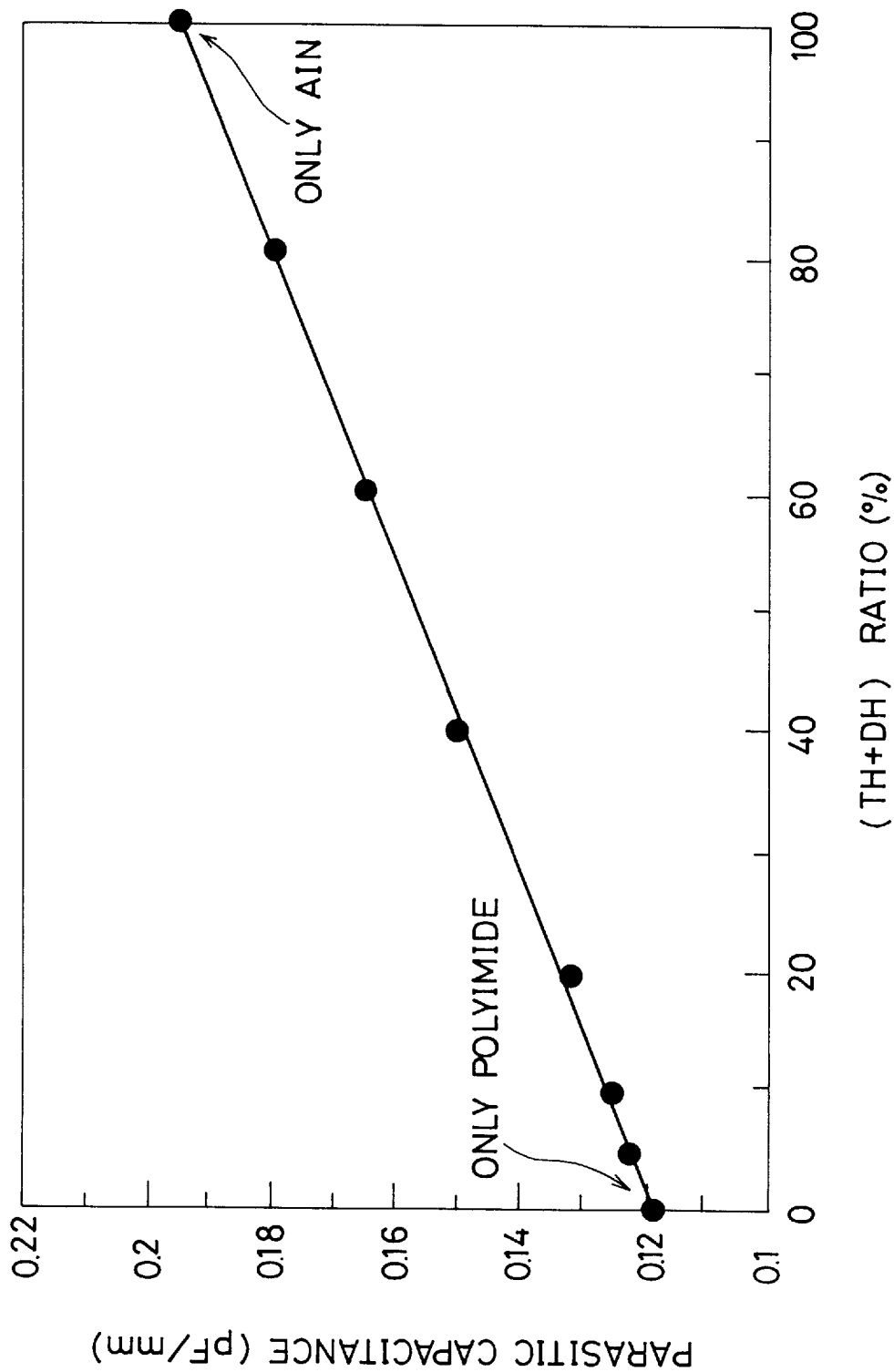
FIG. 7 is a graph showing the relationship between the ratio of (TH+DH) and the parasitic capacitance of wires per unit length (1 mm)
Figure 8:
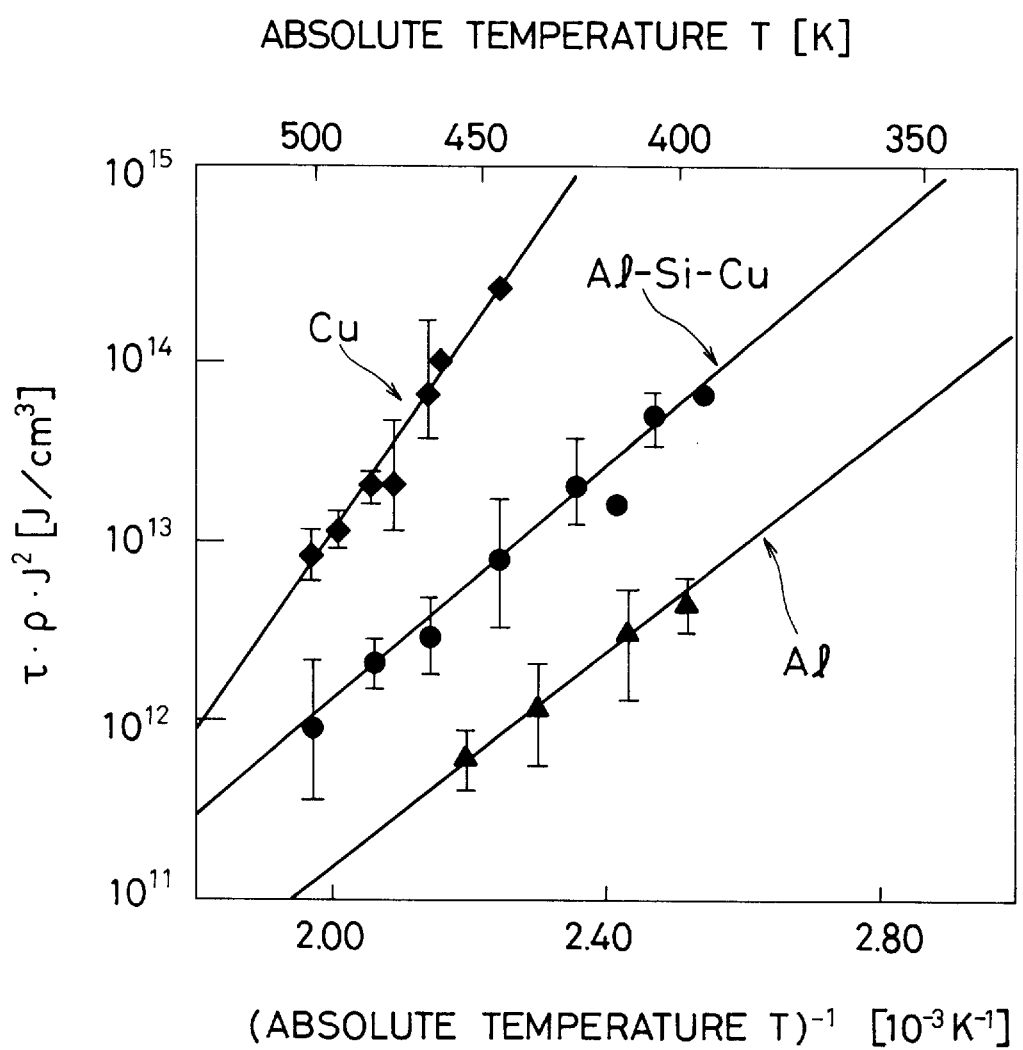
FIG. 8 is a Arrhenius's plot of the product of the wire lifetime $\tau$ and the power $\rho J^2$ applied to unit volume of wires.
Figure 9:
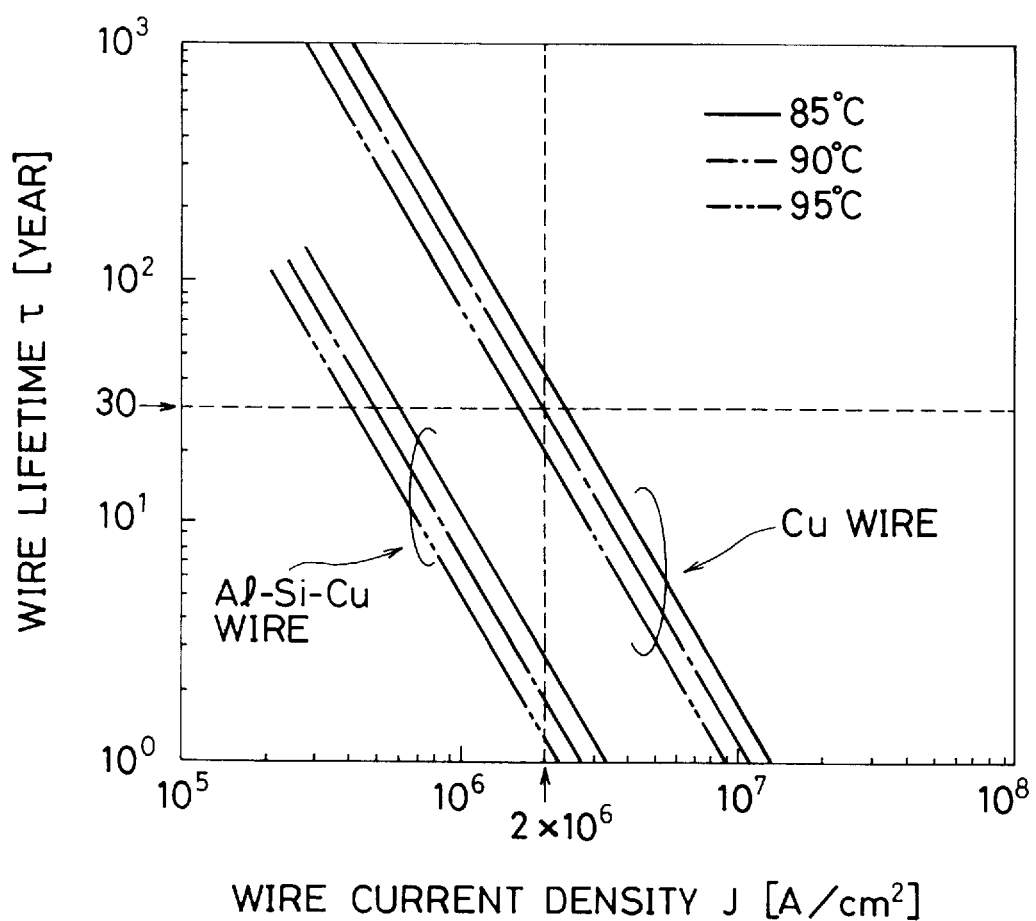
FIG. 9 is a graph showing the result of FIG. 8 which is plotted in terms of the relationship between J and $\tau$.

FIG. 7 summarizes the results as to the relation of the (TH+DH) ratio versus the parasitic capacitance of wiring line per unit length (1 mm). It has been found that the parasitic capacitance is maximized at 0.2 pF/mm in the case of AlN only, and minimized at 0.118 pF/mm in the case of polyimide only. Also, when the (TH+DH) ratio is 10%, the parasitic capacitance was 0.123 pF/mm. It has thus been seen that when the (TH+DH) ratio is 10%, substantially the same value is attained as that in the case of polyimide only.

Table 7 shows the relation of the (TH+DH) ratio versus the electro- and stress-migration life-time τ of Cu wiring lines. In this case, the maximum value=$2 \times 10^6$ A/cm² was used as the current density.

TABLE 7

| | Condition a | Condition b | Condition c | Condition d | Condition e |
|---|---|---|---|---|---|
| Wiring Line Lifetime τ (Year) | 13.4 | 0.28 | 17.3 | 33.3 | 36.6 |

It has been understood from Table 7 that while the wiring line lifetime is 13.4 years in the case of TH only (condition a), extension of the wiring line lifetime becomes available as the (TH+DH) ratio increases. Especially, when the (TH+DH) ratio is 10% (condition e), the wiring line lifetime was 36.6 years, which is thrice as long as that in the case of TH only (condition a).

Further, in the situation that the interlayer dielectric film employs certain material less in relative dielectric constant than polyimide-based resin or Teflon-based resin, since the thermal conductivity decreases accordingly, the following formula could also be found from FIG. 5:

$$(TH+DH) \text{ ratio}: 100 \times (\beta+\gamma)/\alpha > 3.$$

In this embodiment, although one specific case where the semiconductor device employs the 0.18 μm fabrication process is explained herein, separate experimentation tells that both TH and DH should not necessarily be provided depending upon the process conditions, while suggesting presence of the possibility of attaining sufficient wiring line lifetime with use of TH only.

Furthermore, although polyimide or silicon oxide film was employed as the first dielectric materials, i.e. the interlayer dielectric films in this embodiment, the material may alternatively be replaced with $Si_3N_4$, or a multi-layered or composite film of $SiO_2$ and $Si_3N_4$, or any possible combinations thereof.

(Embodiment 4)

In this embodiment consideration was given to the case where only the through-holes (TH) are provided between the wiring-line layers and heat release device whereas both through-holes (TH) and dummy holes (DH) are arranged between respective wiring-line layers and between the wiring-line layers and conductive substrate, while rendering the (TH+DH) ratio variable. The (TH+DH) ratio provided between the wiring-line layers and heat release device was fixed at 15%. Concerning the (TH+DH) ratio, three kinds of conditions—namely; 1% (condition c'), 5% (condition d') and 10% (condition e')—were under consideration. As pursuant to this, the (TH+DH) ratio provided between the wiring-line layers and conductive substrate was set at 20%, (condition c'), 25% (condition d') and 30% (condition e'), respectively.

Polyimide or silicon oxide film was used as the interlayer dielectric material. Cu was employed as TH material, whereas AlN of high thermal conductivity was used as DH material.

The remaining points were the same as those in the embodiment 2.

Table 8 summarizes the TH ratio or (TH+DH) ratio under the conditions a, b and c' to e'. The conditions a, b are those as has been described in the embodiment 2. Specifically, the condition a is the case of exclusive use of TH whereas the condition b is the cases of complete absence of TH and DH.

TABLE 8

| Title of Metal Wiring Line Me' | Title of 1st Dielectric Material I | TH Ratio or (TH + DH) Ratio | | | | |
|---|---|---|---|---|---|---|
| | | Condition a | Condition b | Condition c' | Condition d' | Condition e' |
| Heat Release: C | | | | | | |
| | I8: C–M7 | 15.0 | 0 | 15.0 | 15.0 | 15.0 |
| M7 | | | | | | |
| | I7: M7–M6 | 0.3 | 0 | 1.0 | 5.0 | 10.0 |
| M6 | | | | | | |
| | I6: M6–M5 | 0.4 | 0 | 1.0 | 5.0 | 10.0 |
| M5 | | | | | | |
| | I5: M5–M4 | 0.6 | 0 | 1.0 | 5.0 | 10.0 |
| M4 | | | | | | |
| | I4: M4–M3 | 0.9 | 0 | 1.0 | 5.0 | 10.0 |
| M3 | | | | | | |
| | I3: M3–M2 | 1.3 | 0 | 1.0 | 5.0 | 10.0 |
| M2 | | | | | | |
| | I2: M2–M1 | 1.8 | 0 | 1.0 | 5.0 | 10.0 |
| M1 | | | | | | |
| | I1: M1–B | 15.0 | 0 | 20.0 | 25.0 | 30.0 |
| Substrate: B | | | | | | |

Table 9 indicates the results of investigation as to the relation of the wiring-line temperature at each interlayer dielectric material versus the (TH+DH) ratio. The "wiring-line temperature" may refer to a temperature increase excluding Junction temperature (the temperature of LSI chip as determined by LSI's power consumption; normally, 85° C. in maximum). Numerals within "( )" each represents the standardized value under the condition b.

TABLE 9

| Material of Interlayer Dielectric Film | Wiring-Line Temp. (°C.) (standardized value under condition b) | | | | |
|---|---|---|---|---|---|
| | Condition a | Condition b | Condition c' | Condition d' | Condition e' |
| SiO$_2$ | 7.7 (0.47) | 16.3 (1) | 6.7 (0.41) | 2.4 (0.15) | 1.4 (0.09) |
| polyimide | 15.8 (0.19) | 81.3 (1) | 11.2 (0.14) | 2.3 (0.03) | 1.6 (0.02) |
| AlN | 0.2 (1) | 0.2 (1) | — | — | — |

Comparing Table 6 of the embodiment 3 with Table 9 of this embodiment tells that this embodiment can force the wiring-line temperature to remain lowered more successfully with respect to every condition. Due to this fact, it has been judged that any increase in wiring-line temperature can be avoided by providing both the through-holes (TH) and dummy holes (DH) also.

(Embodiment 5)

In this embodiment consideration was given to the case where both the through-holes (TH) and dummy holes (DH) are provided between respective wiring-line layers of the semiconductor device, between the wiring-line layers and conductive substrate, and between the wiring-line layers and heat release device, while rendering the (TH+DH) ratio variable.

Concerning the (TH+DH) ratio provided between respective wiring-line layers, three kinds of conditions—namely, 1% (condition c"), 5% (condition d") and 10% (condition e")—were under consideration. As pursuant to this, the (TH+DH) ratio provided between the wiring-line layers and conductive substrate, and the (TH+DH) ratio provided between the wiring-line layers and heat release device were set at 20%, (condition c"), 25% (condition d") and 30% (condition e"), respectively.

Polyimide or silicon oxide film was used as the interlayer dielectric material. Cu was employed as TH material whereas PIN of high thermal conductivity was used as DH material.

The remaining points were the same as those in the embodiment 2.

Table 10 summarizes the TH ratio or (TH+DH) ratio under the conditions a, b and c" to e". The conditions a, b are those as has been described in the embodiment 2. Specifically, the condition a is the case of exclusive use of TH whereas the condition b is the cases of complete absence of TH and DH.

TABLE 10

| Title of Metal Wiring Line M | Title of 1st Dielectric Material I | TH ratio or (TH + DH) Ratio | | | | |
|---|---|---|---|---|---|---|
| | | Condition a | Condition b | Condition c" | Condition d" | Condition e" |
| Heat Release: C | | | | | | |
| | I8: C–M7 | 15.0 | 0 | 20.0 | 25.0 | 30.0 |
| M7 | | | | | | |
| | I7: M7–M6 | 0.3 | 0 | 1.0 | 5.0 | 10.0 |
| M6 | | | | | | |
| | I6: M6–M5 | 0.4 | 0 | 1.0 | 5.0 | 10.0 |
| M5 | | | | | | |
| | I5: M5–M4 | 0.6 | 0 | 1.0 | 5.0 | 10.0 |
| M4 | | | | | | |
| | I4: M4–M3 | 0.9 | 0 | 1.0 | 5.0 | 10.0 |
| M3 | | | | | | |
| | I3: M3–M2 | 1.3 | 0 | 1.0 | 5.0 | 10.0 |
| M2 | | | | | | |
| | I2: M2–M1 | 1.8 | 0 | 1.0 | 5.0 | 10.0 |
| M1 | | | | | | |
| | I1: M1–B | 15.0 | 0 | 20.0 | 25.0 | 30.0 |
| Substrate: B | | | | | | |

Table 11 indicates the results of investigation as to the relation oat the wiring-line temperature for each interlayer dielectric material versus the (TH+DH) ratio. The "wiring-line temperature" refers to a temperature increase excluding Junction temperature (the temperature of LSI chip as determined by LSI's power consumption; normally, 85_C in maximum). Numerals within "( )" each represents the standardized value under the condition b.

TABLE 11

| Material of Interlayer Dielectric Film | Wiring-Line Temp. (°C.) (standardized value under condition b) | | | | |
|---|---|---|---|---|---|
| | Condition a | Condition b | Condition c" | Condition d" | Condition e" |
| SiO$_2$ | 7.7 (0.47) | 16.3 (1) | 6.1 (0.37) | 1.8 (0.11) | 0.6 (0.04) |
| polyimide | 15.8 (0.19) | 81.3 (1) | 8.1 (0.09) | 2.1 (0.03) | 1.0 (0.01) |
| AlN | 0.2 (1) | 0.2 (1) | — | — | — |

By Comparing Table 6 of the embodiment 3 Table 9 of embodiment 4 and Table 11 of this embodiment with one another, it may be seen that this embodiment can force the wiring-line temperature to remain lowered more successfully with respect to every condition. Consequently, it has been judged that any increase in wiring-line temperature can also be avoided by providing both the through-holes (TH) and dummy holes (DH).

In the foregoing embodiments 1 to 5, discussions are made under the assumption that the interlayer dielectric films are made of SiO$_2$ or polyimide resin; however, the present technique will also be workable in situations that any other possible insulators are employed therein. This can be said because an increase in wiring-line temperature can be suppressed enabling accomplishment of enhanced reliability by reducing the dielectric constant of substantive interlayer dielectric materials for guarantee of high-speed operation and simultaneously by introducing DH at major portions between wiring lines using chosen dielectric material of high thermal conductivity such as aluminum nitride. Further, in the embodiments 1 to 5, discussions are principally directed to the use of Cu which is one practical wiring-line material and exhibits a minimized resistivity; it should be apparent however that the present technique will alternatively be applicable to aluminum alloy wiring lines, polysilicon and polycide wiring lines.

Figure 10:
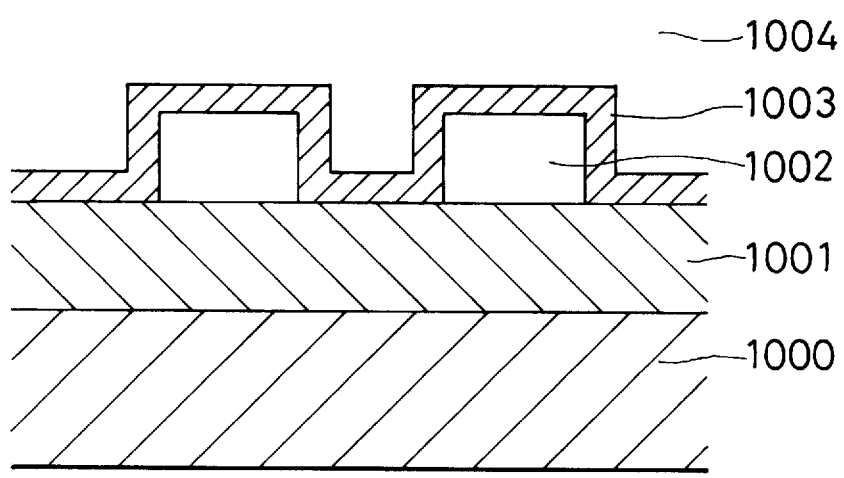
FIG. 10 is a schematic diagram showing the sectional portion of a semiconductor device having a structure that the surface of a metal wire of Cu is coated with a third insulator having high mechanical strength.
Figure 11:
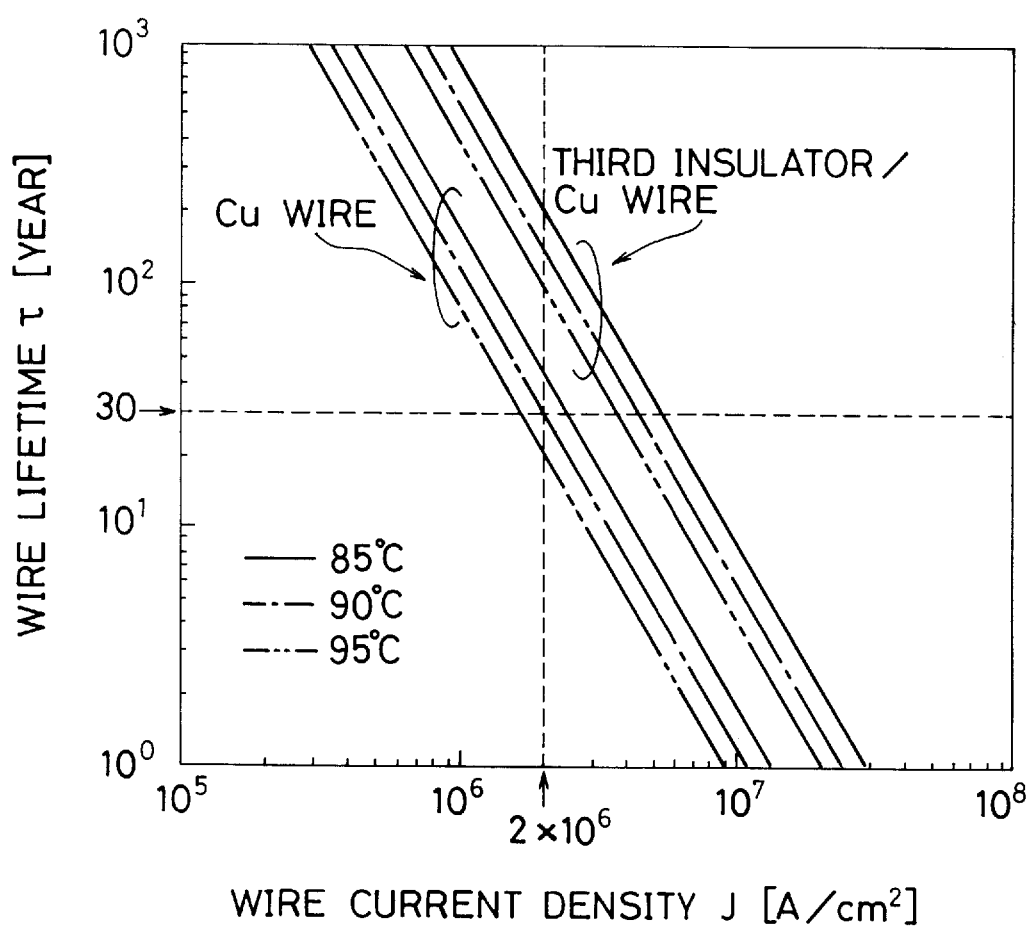
FIG. 11 is a graph showing the relationship between J and $\tau$ in the structure of FIG. 10.
Figure 12:
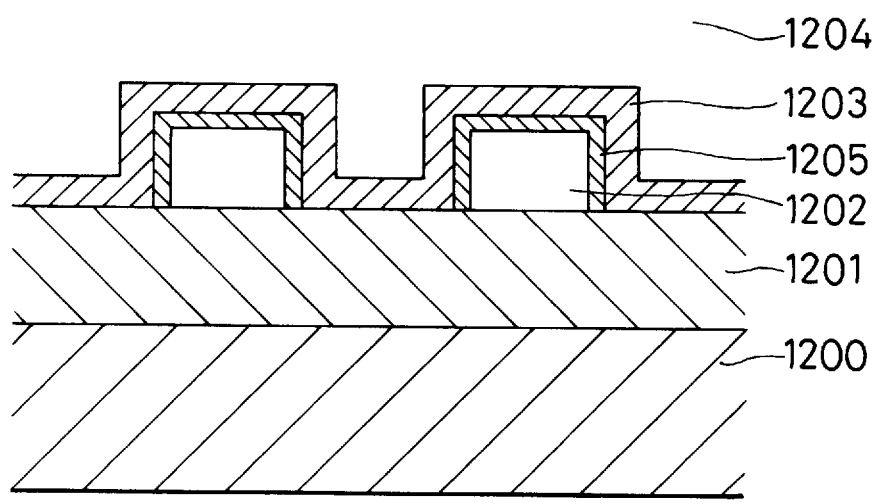
FIG. 12 is a schematic diagram showing the sectional portion of a semiconductor device having a structure that the surface of a metal wire of Cu is coated with silicide or oxide of metal constituting the metal wire or alloy component, and the surface of the silicide or oxide is coated with a third insulator having high mechanical strength.
Figure 13:
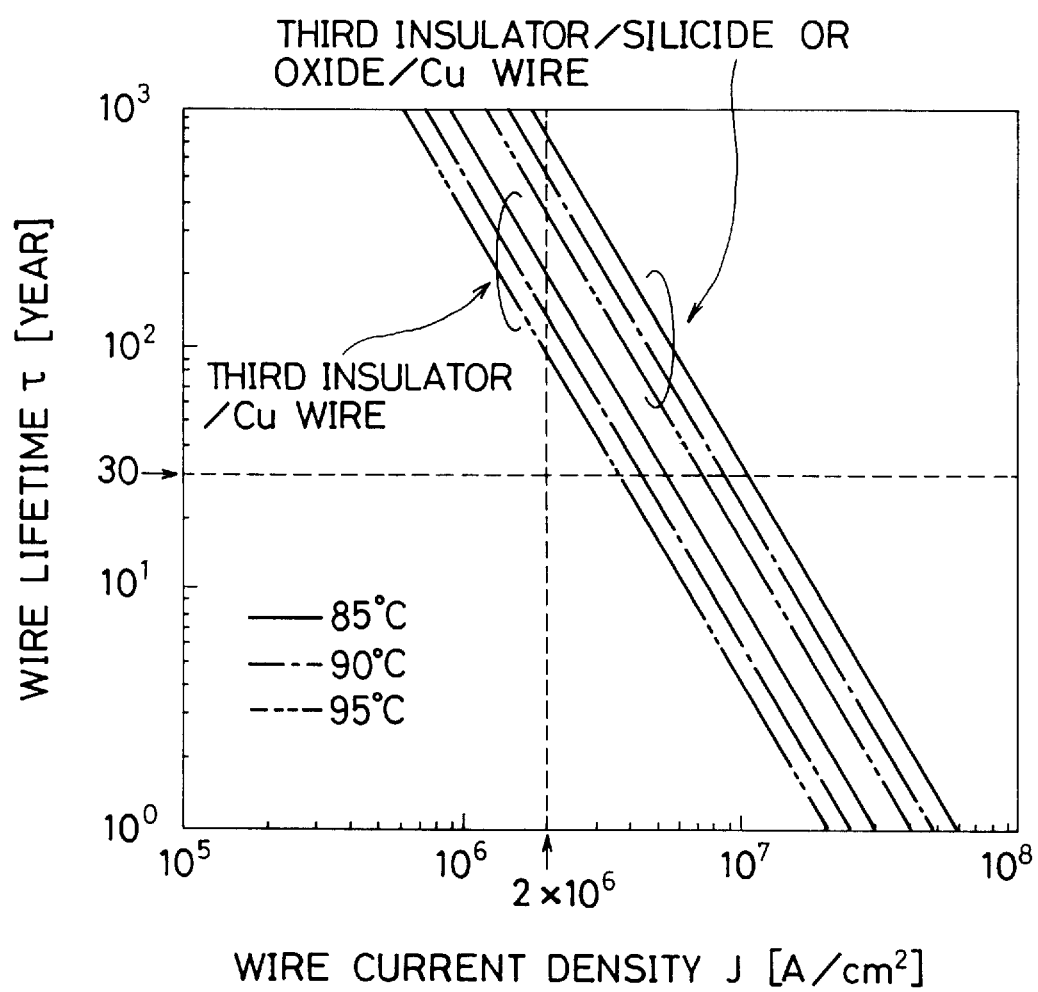
FIG. 13 is a graph showing the relationship between J and $\tau$ in the structure of FIG. 12.

Further, the present technique may also be applicable to the cases (FIG. 10, FIG. 11) where the metal wiring-line surface made of Cu is coated by the third dielectric material with enhanced mechanical strength, and the cases (FIG. 12, FIG. 13) where such metal wiring-line surface is coated by cilicide or oxide of either metal constituting the metal wiring lines or its alloy, and further causing the surface of such cilicide or oxide to be coated by the third dielectric material with enhanced mechanical strength.

Figure 14:
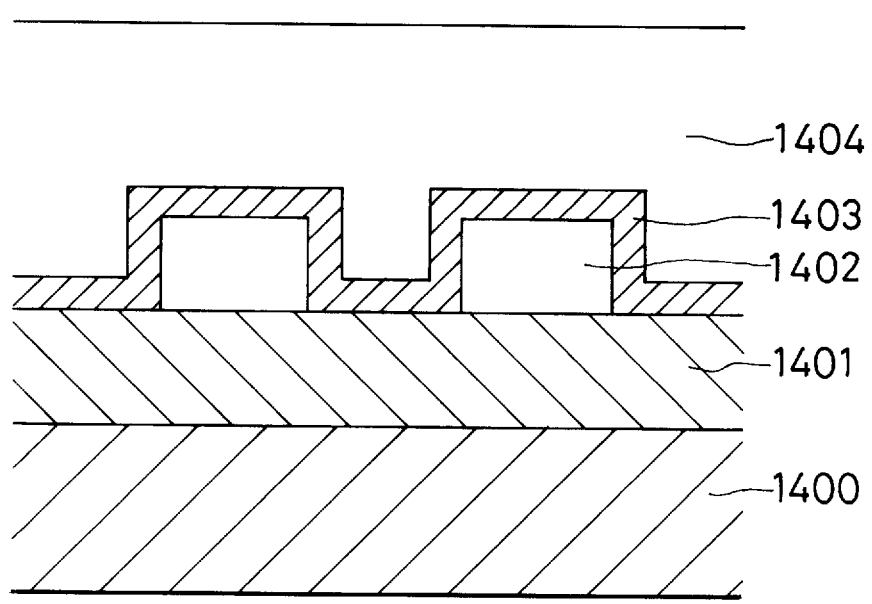
FIG. 14 is a schematic diagram showing the sectional portion of a semiconductor device having a structure that a metal wire of Cu is coated with a fourth insulator.
Figure 15:
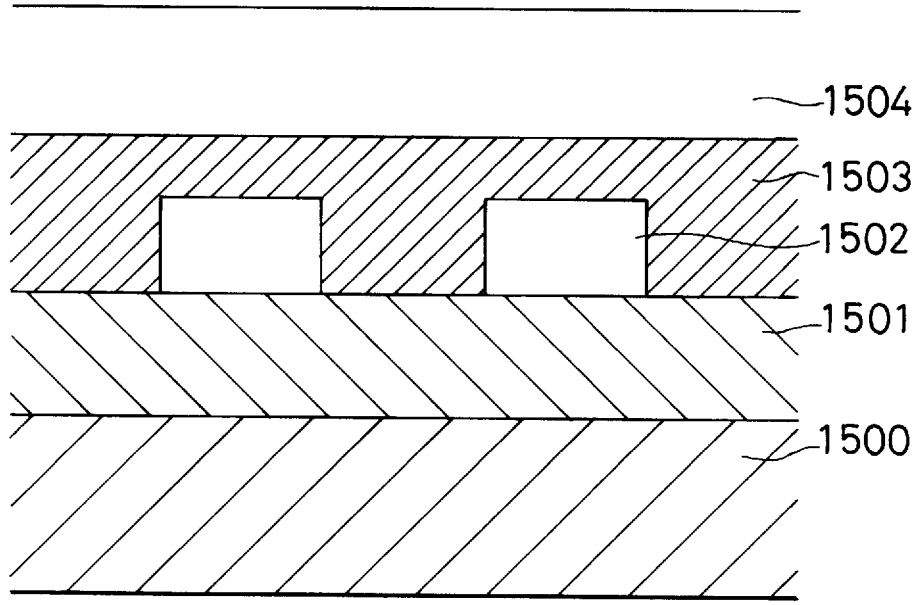
FIG. 15 is a schematic diagram showing the sectional portion of a semiconductor device having a structure that a fourth insulator which is thicker than the thickness of a metal wire of Cu and has a high thermal conductivity is laminated on the metal wire, and the surface of the fourth insulator is flattened.

Furthermore, the technique disclosed herein is also be applicable to the case (FIG. 14) where the metal wiring lines made of Cu are coated by dielectric material (fourth dielectric material) excellent in thermal or heat conductivity such as aluminum nitride, or the case (FIG. 15) where aluminum nitride (fourth dielectric material) is deposited on the metal wiring lines made of Cu with a specific layer structure for letting the surface of aluminum nitride (fourth dielectric material) be subject to planar fabrication process.

Figure 16:
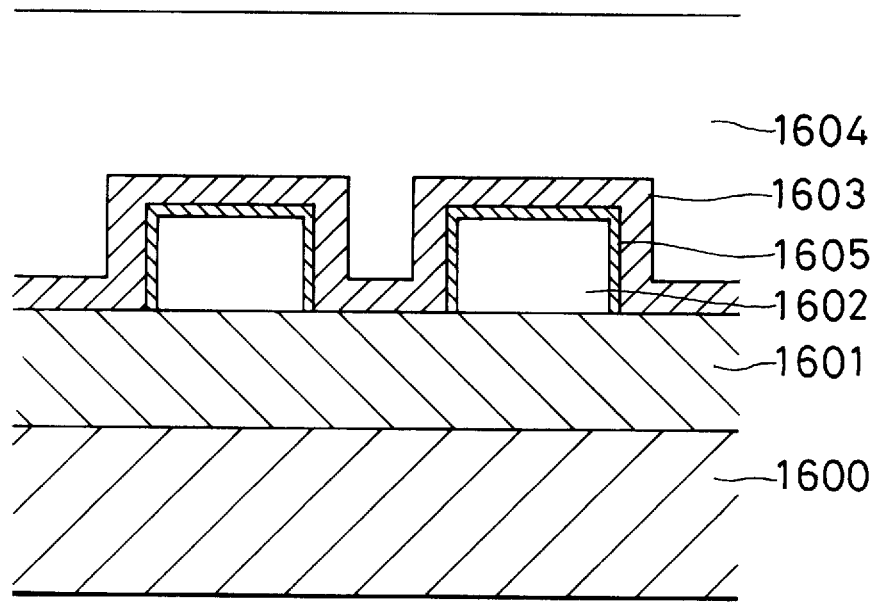
FIG. 16 is a schematic diagram showing a semiconductor device having a structure that the surface of a metal wire of Cu is coated with a third insulator having high mechanical strength and also coated with an insulator (fourth insulator) having high thermal conductivity such as aluminum nitride.
Figure 17:
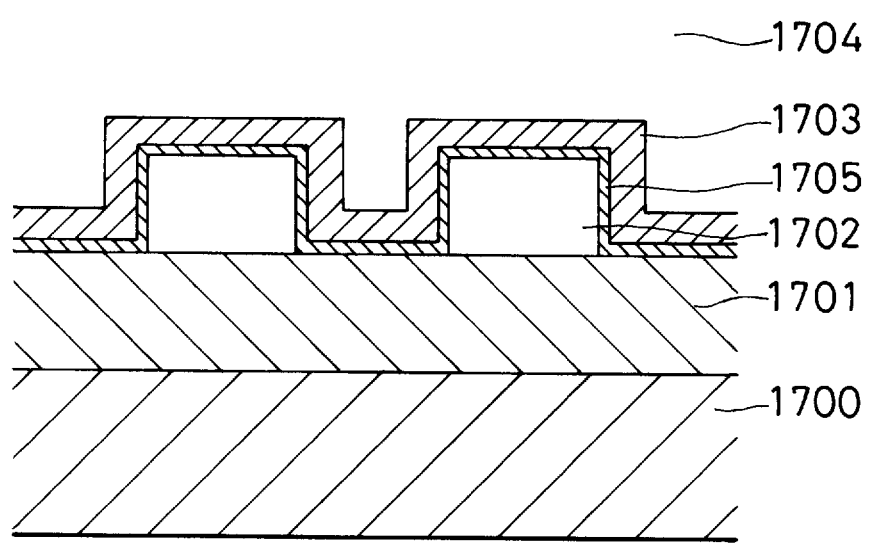
FIG. 17 is a schematic diagram showing the sectional portion of a semiconductor device having a structure that the third insulator of FIG. 13 is coated not only on the surface of the metal wire of Cu, but also on the other portions, and also coated with an insulator (fourth insulator) having high thermal conductivity such as aluminum nitride.

Still further, this technique may alternatively be applied to the cases (FIG. 16, FIG. 17) where the metal wiring lines made of Cu are coated by the third dielectric material with increased mechanical strength, and further coated by additional dielectric material (fourth dielectric material) of good heat conductivity such as aluminum nitride formed thereon.

Industrial Applicability

As has been described previously, in accordance with the present invention, forming specific interlayer dielectric films that can rapidly transmit heat generated and have a structure less in capacitance as inherent in the wiring lines may enable accomplishment of a semiconductor device high both in speed and in reliability.

We claim:

1. A semiconductor device having multi-layered low-resistance wiring lines laminated on one of a top surface and bottom surface of a conductive substrate with a first dielectric material being sandwiched between adjacent layers thereof, said semiconductor device comprising:

said first dielectric material between said low-resistance wiring layers having a through-hole formed therein;

said through-hole having a hole (through-hole: TH) filled with at least a conductive material, and a hole (dummy hole: DH) filled with a second dielectric material greater in thermal conductivity than said first dielectric material.

2. A semiconductor device having multi-layered low-resistance wiring lines laminated on one of a top surface and bottom surface of a conductive substrate with a first dielectric material being sandwiched between adjacent layers thereof, said semiconductor device comprising:

said first dielectric material between said low-resistance wiring layer and said conductive substrate having a through-hole formed therein; said through-hole comprising a hole (through-hole: TH) filled with at least a conductive material, and a hole (dummy hole: DH) filled with a second dielectric material greater in thermal conductivity than said first dielectric material.

3. A semiconductor device having multi-layered low-resistance wiring lines laminated on one of a top surface and bottom surface of a conductive substrate with a first dielectric material being sandwiched between adjacent layers thereof, said semiconductor device comprising:

a heat release device provided through said first dielectric material on the surface of a low-resistance wiring line positioned on the uppermost layer of said low-resistance wiring lines; and said first dielectric material laid between the low-resistance wiring line positioned at the uppermost layer of said low-resistance wiring lines and said heat release device having a through-hole formed therein, and that said through-hole consists of a hole (through-hole: TH) filled with at least a conductive material and a hole (dummy-hole: DH) filled with a second dielectric material having a thermal conductivity greater than that of said first dielectric material.

4. The semiconductor device of claim 1 in which said conductive substrate is metal.

5. The semiconductor device of claim 1 in which said conductive substrate is semiconductor.

6. The semiconductor device of claim 1 in which said conductive substrate is an insulator coated by a semiconductor film.

7. The semiconductor device of claim 1 in which said conductive substrate is metal and coated by a dielectric film, and further coated by a semiconductor film thereon.

8. The semiconductor device of claim 1 in which said first dielectric material is from the group consisting of SiO$_2$, Si$_3$N$_4$, or a multi-layered film of SiO$_2$ and Si$_3$N$_4$, or combination thereof.

9. The semiconductor device of claim 1 in which said first dielectric material is a polymer material less in relative dielectric constant than SiO$_2$.

10. The semiconductor device as in claim 1 in which said first dielectric material is from the group consisting of AlN, a multi-layered film of AlN and SiO$_2$ or Si$_3$N$_4$, or a multi-layered film of AlN and polymer material.

11. The semiconductor device as in claim 1 in which said first dielectric material is one of a polymer material and silicon oxide, wherein said wiring line surface is coated by a third dielectric material with enhanced mechanical strength.

12. The semiconductor device as in claim 1 in which said first dielectric material is one of polymer material and silicon oxide, wherein said wiring line surface is coated by a silicide or oxide of a metal constituting said wiring line or its alloy component, and that the surface of said silicide or oxide is further coated by a third dielectric material with increased mechanical strength.

13. The semiconductor device of claim 12 in which said first dielectric material is polymer material or silicon oxide, in that the metal line surface is coated by a fourth dielectric material with enhanced thermal conductivity.

14. The semiconductor device of claim 12 in which said first dielectric material is one of a polymer material and silicon oxide, wherein said wiring line surface is coated by a fourth dielectric material being greater in thickness that said wiring lines and better in thermal conductivity, and that the surface of said fourth dielectric material is so formed as to resemble in shape a planar structure.

15. The semiconductor device of as in any of claims 13 in which said first dielectric material is $SiO_2$, and has a (TH+DH) ratio given as:

(TH+DH) ratio: $100 \times (\beta+\gamma)/\alpha = 2$, where $\alpha$ is the value of wiring line length L of said low-resistance wiring lines as divided by the wiring line pitch P, $\beta$ is the number of said through-holes (through-holes: TH) filled with the conductive material in said wiring length L, and $\gamma$ is the number of through-holes (dummy-holes: DH) filled with the second dielectric material greater in thermal conductivity than said first dielectric material in said wiring line length L.

16. The semiconductor device as any of claims 1–3 in which said first dielectric material is polyimide-based resin or Teflon-based resin, and has a (TH+DH) ratio given as (TH+DH) ratio: $100 \times (\beta+\gamma)/\alpha = 3$, where $\alpha$ is the value of wiring length line L of said low-resistance wiring lines as divided by the wiring line pitch P, $\beta$ is the number of said through-holes (through-holes: TH) filled with the conductive material in said wiring ling length L, and $\gamma$ is the number of through-holes (dummy-holes: DH) filled with the second dielectric material greater in thermal conductivity than the said first dielectric material in said wiring line length L.

17. The semiconductor device of any of claims 1–3 in which a material less in relative dielectric constant than polyimide-based resin or Teflon-based resin is used as said first dielectric material, the (TH+DH) ratio given as (TH+DH) ratio: $100 \times (\gamma+\gamma)/\alpha > 3$, where $\alpha$ is the value of wiring line length L of said low-resistance wiring lines as divided by the wiring line pitch P, $\beta$ is the number of said through-holes (through-holes: TH) filled with the conductive material in said wiring line length L, and $\gamma$ is the number of through-holes (dummy-holes: DH) filled with the second dielectric material greater in thermal conductivity than said first dielectric material in said wiring line length L.

18. The semiconductor device as in any of claims 1–3 in which said second dielectric material is aluminum nitride (AlN).

19. The semiconductor device of claim 1 in which said second dielectric material is formed by the CVD method using as original materials a gaseous compound containing aluminum and a gaseous compound containing nitride.

20. The semiconductor device of claim 19 wherein said gaseous compound containing aluminum is one selected from the group consisting of aluminum hydroxide ($AlH_3$) dimethyl aluminum hydride ($Al(CH_3)_2H$), trimethyl aluminum ($Al(CH_3)_3$), triethyl aluminum ($Al(C_2H_5)_3$), tri-isobuthyl aluminum ($Al(i-C_4H_9)_3$), methyl aluminum dihydride ($Al(CH_3)H_2$), and trimethylaminealane ($AlH_3N(CH_3)_3$).

21. The semiconductor device of claim 19, wherein said gaseous compound containing nitride is one selected from the group consisting of nitrogen trichloride ($NCl_3$), nitrogen trifluoride ($HF_3$), dinitrogen monoxide ($N_2O$), nitrogen monoxide (NO), dinitrogen trioxide ($N_2O_3$), and ammonia ($NH_3$).

* * * * *